United States Patent [19]
Genest

[11] Patent Number: 6,066,990
[45] Date of Patent: May 23, 2000

[54] FREQUENCY DIVIDER HAVING A PRESCALER FOLLOWED BY A PROGRAMMABLE COUNTER, AND A CORRESPONDING PRESCALER AND FREQUENCY SYNTHESIZER

[75] Inventor: Pierre Genest, Butry Sur Oise, France

[73] Assignee: Alcatel, Paris, France

[21] Appl. No.: 09/084,981

[22] Filed: May 28, 1998

[30]    Foreign Application Priority Data

May 29, 1997  [FR]  France ................................... 97 06591

[51] Int. Cl.$^7$ ....................................... H03K 21/00
[52] U.S. Cl. .............................. 331/25; 331/1 A; 331/16; 377/47; 377/48; 327/115; 327/117
[58] Field of Search .................. 377/48–52, 44, 377/47–107; 331/1 A, 16, 25; 327/115, 117

[56]               References Cited

U.S. PATENT DOCUMENTS

| | | | |
|---|---|---|---|
| 4,414,687 | 11/1983 | Hirata | 455/165 |
| 5,066,927 | 11/1991 | Dent | 331/1 A |
| 5,614,869 | 3/1997 | Bland | 331/1 A |

FOREIGN PATENT DOCUMENTS

| | | |
|---|---|---|
| 0171162A2 | 2/1986 | European Pat. Off. . |
| 3126317A1 | 1/1983 | Germany . |
| WO8102371 | 8/1981 | WIPO . |

OTHER PUBLICATIONS

Patent Abstracts Of Japan, vol. 011, No. 343 (E–555), Nov. 10 1987 corresponding to JP 62 122421 A (Hitachi LTD; Others:01), Jun. 3 1987.

Patent Abstracts Of Japan, vol. 8, No. 181 (E–261) [1618], Aug. 21 1984 corresponding to JP 59 074734 A (Clarion K.K.), Apr. 27 1984.

*Primary Examiner*—Arnold Kinkead
*Attorney, Agent, or Firm*—Sughrue, Mion, Zinn, Macpeak & Seas, PLLC

[57]                ABSTRACT

The invention relates to a frequency divider of the type comprising a prescaler followed by a programmable counter, and serving to divide by an overall division ratio D that can be written D=k.N+A. The prescaler operates with a pair of division ratios k/k+1, and includes means for changing from the higher division ratio k+1 to the lower division ratio k as a function of a modulus control signal. N is a first predetermined programmable value corresponding to the division ratio of the programmable counter. A is a second predetermined programmable value such that on being reached by the programmable counter, the prescaler receives the modulus control signal. The following is true: $0 \leq A < N$. According to the invention, the prescaler has at least two successive pairs of division ratios p/p+1, p+1/p+2, p+2/p+3, etc., and includes selection means for dynamically selecting one of the pairs as a function of a selection signal, the selected pair constituting the operating pair k/k+1. The selection signal depends on the overall division ratio D that the frequency divider is to apply.

5 Claims, 1 Drawing Sheet

6,066,990

FREQUENCY DIVIDER HAVING A PRESCALER FOLLOWED BY A PROGRAMMABLE COUNTER, AND A CORRESPONDING PRESCALER AND FREQUENCY SYNTHESIZER

FIELD OF THE INVENTION

The field of the invention is that of frequency dividers.

More precisely, the invention relates to a frequency divider of the type comprising a prescaler followed by a programmable counter.

The invention also relates to a phase-locked loop (PLL) frequency synthesizer including such a frequency divider, and to the prescaler as such.

BACKGROUND OF THE INVENTION

A frequency prescaler is designed to be used upstream from a programmable counter. The frequency divider constituted by those two elements taken together needs to be capable of performing division by a selected overall division ratio (written D below).

The divider of the invention particularly, but not exclusively, is designed for implementation in a phase-locked loop frequency synthesizer. Such a synthesizer comprises a frequency divider enabling the output frequency $f_s$ of the synthesizer to be divided by D so as to obtain the feedback loop frequency $f_b$. In other words, $f_b=f_s/D$.

The loop frequency $f_b$ and the comparison frequency $f_c$ constitute respective ones of two inputs to the phase comparator included in the frequency synthesizer.

The output frequency $f_s$ of the synthesizer is either equal to the radio frequency or is n times greater than the radio frequency (for reasons given below). The radio frequency is a variable frequency lying within a predetermined range. It is incremented in steps of a size that corresponds to the bandwidth of a radio channel. The idea is to be able to generate all of the existing radio channels, and it is specifically by acting on the overall division ratio D of the frequency divider that it is possible to switch from one radio channel to another.

In the context of the present invention, the prescaler is considered as operating with a pair of division ratios, written k/k+1, and referred to as the operating pair in the description below. The prescaler has means for changing over between the higher division ratio k+1 to the lower division ratio k in the operating pair k/k+1, as a function of a changeover signal (also known as a "modulus control" signal).

In general terms, the overall division ratio D of a frequency divider can be written D=k.N+A, where:

N is a first predetermined programmable value corresponding to the division ratio of the programmable counter; and A is a second predetermined programmable value which, on being reached by the programmable counter, causes the prescaler to receive the changeover signal. It should be observed that it is necessary for the relationship $0 \leq A<N$ to be satisfied.

It will be observed that frequency dividers must be capable of receiving and thus of working at ever-increasing frequencies.

Thus, it is now commonplace for the output frequency $f_s$ of a synthesizer (i.e. the frequency which the frequency divider must divide by D so as to obtain the loop frequency $f_b$) to be a frequency that is n times greater than the radio frequency. This makes it possible to solve problems of shielding associated with direct transposition, and to improve phase noise, providing that comparison also takes place at a multiple frequency.

In other words, it is now the practice to use an output frequency $f_s$ from the synthesizer and a comparison frequency $f_c$ both of which are multiples of the frequencies that used to be used in the past (e.g. n times greater).

This known technique, which consists in using an output frequency $f_s$ and a comparison frequency $f_c$ that are multiples of those used in the past, is described below both for the GSM 900 case ("Global system for mobile communication operating in the 900 MHz band") and in the DCS 1800 case ("Digital communication system" operating in the 1800 MHz band).

In the GSM 900 standard, the radio frequency band lies around 900 MHz. By selecting, by way of example, a synthesizer that gives an output frequency $f_s$ that is four times greater than the radio frequency, i.e. $f_s=4\times900$ MHz=3.6 GHz, it is possible to obtain a synthesizer having phase noise that is much lower if the comparison frequency is likewise four times greater than the present comparison frequency, i.e. $f_c=4\times200$ kHz=800 kHz.

In the DCS 1800 standard, the radio frequency band lies around 1.8 GHz. By selecting, for example, a synthesizer delivering an output frequency $f_s$ that is twice as high as the radio frequency, i.e. $f_s=2\times1800$ MHz=3.6 GHz, then the synthesizer will give much lower phase noise if the comparison frequency is likewise twice as high as the present comparison frequency, i.e. $f_c2\times200$ kHz=400 kHz.

This multiplication by n of the output frequency $f_s$ and of the comparison frequency $f_c$ has no effect on the overall division ratio D that the divider needs to apply for a desired radio channel of frequency $f_r$. Because the loop frequency $f_b$ converges on the comparison frequency $f_c$, using an output frequency $f_s$ and a comparison frequency $f_c$ that are n times greater than before amounts to using an output frequency $f_s$ and a loop frequency $f_b$ that are n times greater than before. Consequently, to obtain a given radio channel of radio frequency $f_r$, the overall division ratio D of the divider remains unchanged since $D=f_s/f_b=n.f_s/n.f_b$.

In contrast, multiplying the output frequency $f_s$ and the comparison frequency $f_c$ in this way by n is not without its effects on the hardware. The frequency which the divider receives is multiplied by n. Consequently, since the overall division ratio D is unaffected, two solutions can be envisaged:

either both division ratios in the pair of prescaler division ratios k/k+1 remain unchanged and the division ratio of the programmable counter is multiplied by n; or the pair of division ratios k/k+1 of the prescaler is multiplied by n (if n=2, then the pair k'/k'=1 is used, where k'=2.k), and the division ratio of the programmable counter remains unchanged.

Unfortunately, both of those two solutions suffer from drawbacks.

With the first solution, the programmable counter receives a frequency that is n times higher than that which it receives at present. Thus, with n=2, the frequency input to the programmable counter will be 60 MHz instead of the present 30 MHz. Unfortunately, such an increase in frequency is not always possible because the programmable counter is generally implemented in CMOS and has a limited operating speed. In other words, the programmable counter is designed for "low frequency" operation. In any event, even if the programmable counter can accommodate such an increase in the frequency it receives, that can only be achieved at the cost of a large increase in power consumption, and possibly also with repercussions on noise in the phase-locked loop, because of the smaller ratio between the maximum frequency that the technology can accommodate and the frequency at which it actually operates.

It is therefore normal practice to seek to increase the division ratios of the prescaler (the second of the above-mentioned solutions). From the formula D=k.N+A, A needs to be capable of varying over the range 0 to k−1 in order to make it possible to implement all division ratios D (i.e. so that all channels can be addressed). Unfortunately, because of the relationship $0 \leq A < N$, A cannot vary over the range 0 to k−1 if N<k−1(since under such circumstances that would give A<N<k−1). In other words, if N<k−1, then it is not possible to provide all of the necessary division ratios.

For example, with k=128, then $N_{min}$=64. From the formula D=k.N+A, and from the relationship $0 \leq A \leq N-1$, it can be deduced that $k.N \leq D \geq k.N+(N-1)$. Thus, taking successive values of N from $N_{min}$, the following are obtained:

for N=64: $8192 \leq D \leq 8255$;(division ratios 8256 to 8319 are missing)

for N=65: $8320 \leq D \leq 8384$;(division ratios 8385 to 8447 are missing)

for N=66: $8448 \leq D \leq 8513$;

etc.

Thus, in this example, division ratios 8256 to 8319, 8385 to 8447, etc. cannot be implemented.

To sum up, it would appear that present frequency dividers are incapable of satisfying the new requirement of operating at ever-increasing frequency.

OBJECTS AND SUMMARY OF THE INVENTION

A particular object of the present invention is to mitigate the various drawbacks of the state of the art.

More precisely, one of the objects of the present invention is to provide a frequency divider of the type comprising a prescaler followed by a programmable counter, and that is capable of receiving very high frequencies.

Another object of the invention is to provide such a divider which avoids increasing the frequency at which the programmable counter operates, while still making it possible to implement the necessary division ratios D.

These various objectives, and others that appear below, are achieved by the invention by means of a frequency divider of the type comprising a prescaler followed by a programmable counter, and serving to divide a first frequency by an overall division ratio D that can be written D=k.N+A, so as to obtain a second frequency, said prescaler being of the type that operates with a pair of division ratios, written k/k+1, and including means for changeover from the higher division ratio k+1to the lower division ratio k of said operating pair k/k+1as a function of a modulus control signal, N being a first predetermined programmable value corresponding to the division ratio of said programmable counter, and A being a second predetermined programmable value such that on being reached by the programmable counter, the prescaler receives said modulus control signal, with the relationship $0 \leq A < N$ necessarily being satisfied;

wherein said prescaler has at least two successive pairs of division ratios, written respectively p/p+1, p+1/p+2, p+2/p+3, etc., and wherein said prescaler includes selection means for dynamically selecting one of said pairs of division ratios as a function of a selection signal, the selected pair constituting said operating pair k/k+1, said selection signal depending on said overall division ratio D that said frequency divider is to apply.

Thus, the general principle of the invention consists in dynamically selecting a pair of division ratios for the prescaler that are selected from a plurality of pairs of successive division ratios as a function of the overall division ratio D that is to be applied.

Thus, even when the frequency to be divided is very high (in particular n times greater than that used at present, and using the same notation as above), it is possible to find pairs of successive division ratios for the prescaler p/p+1, p+1/p+2, p+2/p+3, etc. such that the operating frequency of the programmable counter does not need to be increased, and such that all of the necessary division ratios D can be implemented.

Advantageously, N has a minimum value $N_{min}$, such that: $N_{min}$=S(p/c), where:

p is the smaller division ratio of the first of said successive pairs of division ratios p/p+1, p+1/p+2, p+2/p+3, etc.;

S is a function such that S(x) is the first integer greater than or equal to x; and c is the number of successive pairs of division ratios p/p+1,p+1/p+2, p+2/p+3, etc.

In a particular embodiment of the invention, said prescaler can switch dynamically between the following two successive pairs of division ratios: 127/128, and 128/129, as a function of said selection signal.

This particular embodiment of the invention, as described in greater detail below, can be implemented in particular in a frequency synthesizer for application to GSM 900, to DCS 1800, or indeed to PCS 1900.

The invention also provides a frequency synthesizer of the phase-locked loop type, the synthesizer comprising:

a phase comparator receiving both a loop frequency $f_b$ and a comparison frequency $f_c$ which is obtained from a clock frequency $f_h$ as delivered by a resonant element;

a loop filter receiving the output from said phase comparator;

a voltage controlled oscillator receiving the output from said loop filter, and generating the output frequency $f_s$ of said synthesizer; and programmable divider means dividing said output frequency $f_s$ to obtain said loop frequency $f_b$;

wherein said programmable divider means comprise a frequency divider as specified above enabling said output frequency $f_s$ to be divided by said overall division ratio D so as to obtain said loop frequency $f_b$.

The invention also provides a frequency prescaler of the type designed to be used in a frequency divider, the prescaler having at least two successive pairs of division ratios respectively written p/p+1, p+1/p+2, p+2/p+3, etc.; and the prescaler including selection means for dynamically selecting one of said pairs of division ratios as a function of a selection signal, the selected pair constituting said operating pair k/k+1,said selection signal depending on the overall division ratio D that the frequency divider is to apply.

BRIEF DESCRIPTION OF THE DRAWING

Other characteristics and advantages of the invention appear on reading the following description of a preferred embodiment of the invention, given by way of non-limiting indication, and with reference to the accompanying drawing, in which.

MORE DETAILED DESCRIPTION

The invention thus relates to a frequency divider of the type comprising a prescaler followed by a programmable counter. The divider serves to divide a first frequency by an overall division ratio D, so as to obtain a second frequency. As explained in detail below, the overall division ratio D can be written D=k.N+A.

Such a frequency divider is implemented, for example, in a phase-locked looped frequency synthesizer, said synthesizer itself being included, for example, in a radio communications terminal, particularly, but not exclusively, of the GSM 900, DCS 1800, or PCS 1900 type.

Figure 1:
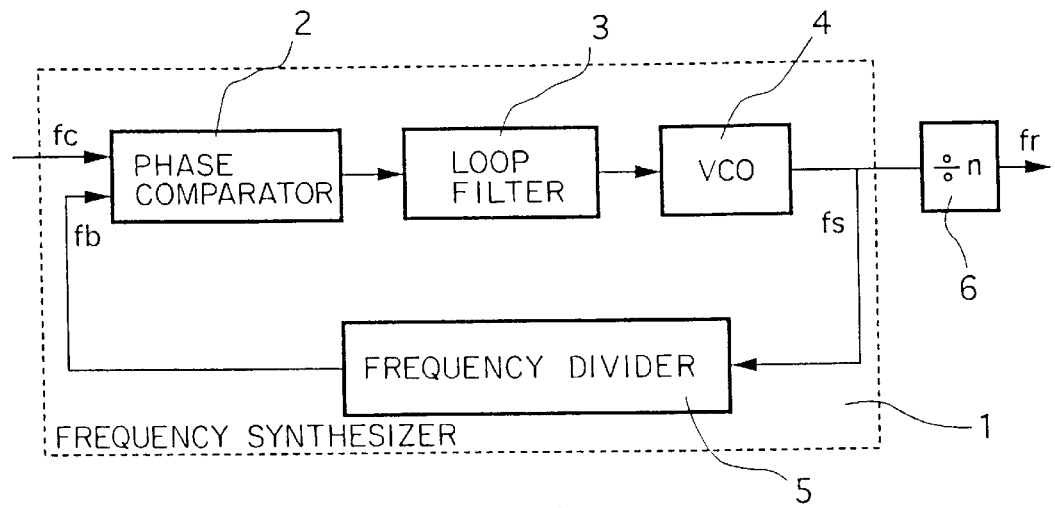
FIG. 1 is a block diagram of a particular embodiment of a frequency synthesizer capable of including a frequency divider of the invention.

As shown in FIG. 1, in a particular embodiment, the frequency synthesizer 1 comprises:

a phase comparator 2 which receives a comparison frequency $f_c$ and a loop frequency $f_b$ (obtained in a manner described below);

a loop filter 3 whose input receives the output from the phase comparator 2;

a voltage controlled oscillator (VCO) 4 whose input receives the output from the loop filter 3, and which generates the output frequency $f_s$ of the synthesizer 1; and a frequency divider 5 which generates the loop frequency $f_b$ from the output frequency $f_s$ of the synthesizer 1.

In general, the comparison frequency $f_c$ is obtained by dividing a clock frequency $f_h$ generated by a resonant element (not shown), e.g. a voltage controlled crystal oscillator (VCXO).

The output frequency $f_s$ is such that $f_s=n.f_r$, where n is an integer greater than or equal to 2 (generally n is a power of 2). By having the frequency synthesizer generate an output frequency $f_s$ that is a multiple of the radio frequency $f_r$ instead of synthesizing the radio frequency $f_r$ directly, it is possible, in particular, to eliminate the impact of external coupling on the apparatus, thereby making it possible to use less shielding in transmission and to lower the offset voltage on reception.

Divider means 6 placed downstream from the synthesizer 1 divide the output frequency $f_s$ from the synthesizer 3 by n, thereby obtaining the radio frequency $f_r$.

By means of the phase-locked loop, the loop frequency $f_b$ converges on the comparison frequency $f_c$. Consequently, as a function of the overall division ratio D selected for the divider 5, the synthesizer generates an output frequency $f_s$ which converges on $D.f_c$. In other words, by varying D, it is possible to address all of the radio channels. Since $f_s=n.f_r$, for any desired value of $f_r$ (corresponding to a particular radio channel), D is selected so that $D=n.f_r/f_c$.

Thus, for DCS 1800, a VCO 4 is used having an output frequency $f_s$ lying in a range situated around 3.6 GHz, and the comparison frequency $f_c$ is selected to be equal to 400 kHz (i.e. n×200 kHz for n=2, where n is the ratio $f_s/f_r$). It is also recalled that under such circumstances, the band of radio frequencies $f_s$ is situated around 1.8 GHz (more precisely 1710–1785 MHz in the up direction and 1805–1880 MHz in the down direction). Finally, each channel has a bandwidth of 200 kHz, so there are 374 channels in each direction.

Returning to the above example, to address the first channel (centered on $f_r$=1710 MHz) in the up direction for DCS 1800, the following selection is made: $D=n.f_r/f_c=2\times 1710$ MHz/400 kHz=8550. Similarly, to address the last channel in the up direction (centered on $f_r$=1785 MHz), the following selection is made: $D=n.f_r/f_c=2\times 1785$ MHz/400 kHz=8925. The frequency divider 5 must therefore generate all division ratios D lying in the range 8550 to 8925 so that all of the up channels of DCS 1800 can be addressed.

It is clear that there exist various ranges within which it is necessary to be able to vary the division ratio D, said ranges being a function of the direction (up or down) of the channels to be addressed, of the ratio n between $f_s$ and $f_r$, and of the standard that is in use (GSM 900, DCS 1800, PCS 1900, . . .).

Figure 2:
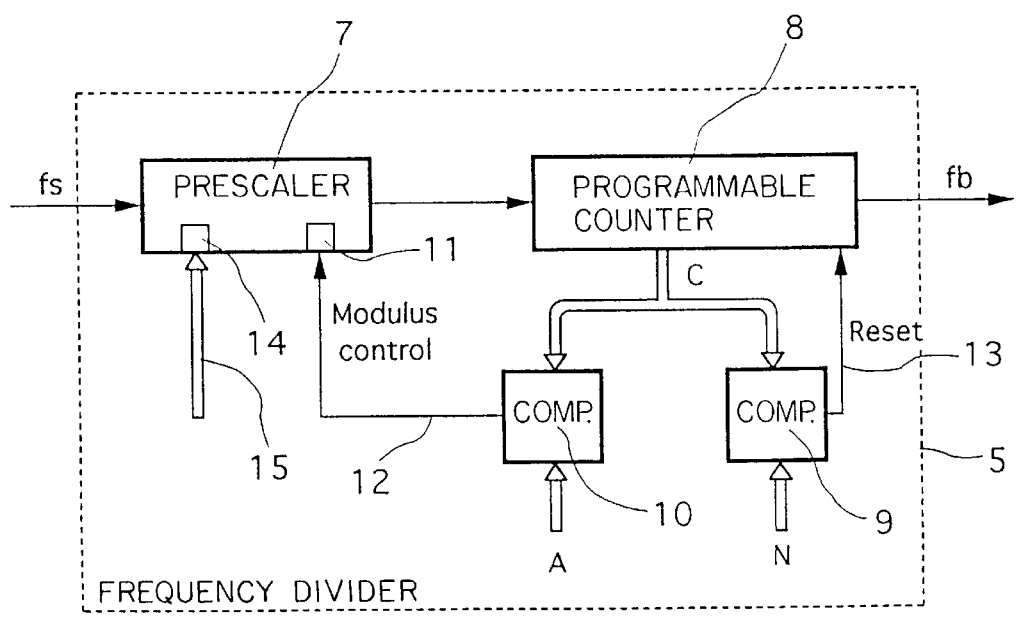
FIG. 2 shows a particular embodiment of a frequency divider of the invention.

FIG. 2 shows a particular embodiment of the frequency divider of the invention. In the description below, it is assumed that the frequency divider is the divider referenced 5 in FIG. 1 and is therefore designed to be implemented in the frequency synthesizer 1.

It is nevertheless clear that the divider of the invention can be applied to other circumstances, and more generally to all cases where a large division ratio D needs to be implemented, without requiring the low-frequency portion (i.e. the programmable counter) to be modified.

In conventional manner, the frequency divider 5 comprises a prescaler 7, a programmable counter 8, and first and second comparators 9 and 10. The roles and the functions of these elements are summarized below.

When the first comparator 9 detects that the current value C of the programmable counter 8 has reached a first predetermined programmable value N, it generates a "reset" signal 13 which resets the programmable counter 8 to zero. Thus, the first predetermined programmable value N corresponds to the division ratio of the programmable counter 8.

When the second comparator 10 detects that the current value C of the programmable counter has reached a second predetermined programmable value A, it generates a "modulus control" signal 12 for changeover purposes, where changeover is as described below.

It should be observed that the relationship $0 \leq A \leq N$ need not necessarily be satisfied.

The prescaler 7 is of the type operating with a pair of division ratios, written k/k+1. It includes means 11 for changeover from the higher division ratio k+1 to the lower division ratio k on receiving the modulus control signal 12. The modulus control signal may correspond, for example, to a particular bit changing from 0 to 1.

In other words, the prescaler 7 divides by k+1 until the programmable counter reaches A, and then by k until the programmable counter reaches N. The division ratio D of the programmable counter 8 can thus be written:

$$D=(k+1).A+k.(N-1)=k.N+A$$

According to the present invention, the prescaler 7 has at least two pairs of successive division ratios, written respectively p/p+1, p+1/p+2, p+2/p+3, etc. In addition, the prescaler 7 has means 14 for dynamically selecting one of the pairs of division ratios as a function of a selection signal 15.

The selected pair constitutes the operating pair k/k+1. The selection signal 15 depends on the overall division ratio D that the frequency divider 5 is to apply.

With the invention, there are therefore as many formulae of the type D=k.N+A as there are distinct pairs of division ratios that can be selected. Specifically, the following formulae apply:

D=p.N+A if the pair p/p+1 is selected

D=(p+1).N+A if the pair p+1/p+2 is selected $D=(p+2).N+A$ if the pair p+2/p+3 is selected etc.

Thus, depending on the particular radio channel that is to be addressed, i.e. as a function of the division ratio D that is to be implemented, the values A and N are programmed (e.g. in a microcontroller) and, also, one of the successive pairs of division ratios p/p+1, p+1/p+2, p+2/p+3,etc. is selected.

By way of comparison, it is recalled that in known frequency dividers, the prescaler uses only one single pair of division ratios. Consequently, only the values for A and N need to be programmed.

To ensure that the range of division ratios D does not have any gaps, the value N must have a minim value $N_{min}$ such that $N_{min}=S\ (p/c)$, where:

p is the smaller division ratio of the first successive pair of division ratios p/p+1, p+1/p+2, p+2/p+3,etc.;

S is a function such that S(x) is the first integer greater than or equal to x; and c is the number of successive pairs of division ratios p/p+1, p+1/p+2, p+2/p+3, etc.

For example, with c=2 and p=127 (i.e. with a prescaler having two pairs: 127/128 and 128/129), then $N_{min}=64$. For explanatory purposes, it is demonstrated below in the context of this example that 64is indeed the minimum value of N and that all division ratios D can be implemented:

for N=63, with the pair 127/128: $8001 \leq D \leq 8063$; with the pair 128/129: $8064 \leq D \leq 8126$; (division ratio D=8127 is missing);

for N=64, with the pair 127/128: $8128 \leq D \leq 8191$; with the pair 128/129: $8192 \leq D \leq 8255$; (no division ratio D is missing);

for N=65, with the pair 127/128: $8255 \leq D \leq 8319$; with the pair 128/129: $8320 \leq D \leq 8384$; (no division ratio D is missing);

for N=66, with the pair 127/128: $8382 \leq D \leq 8447$; with the pair 128/129: $8448 \leq D \leq 8513$;

etc.

From this example, it is clear that although all division ratios D can be implemented for $N \leq 64$, that is not true for $N \leq 64$.

It should be observed that with the two above-mentioned pairs, i.e. 127/128 and 128/129, it is possible to implement all division ratios from 8128. This makes it possible to address, in particular:

all GSM 900 channels with a synthesizer output frequency $f_s$ lying in a range situated around 3.6 GHz ($f_s=4.f_r$), and a comparison frequency $f_c$ equal to 400 kHz; and all DCS 1800 channels with a synthesizer output frequency $f_s$ lying in a range situated around 3.6 GHz ($f_s=2.f_r$), and a comparison frequency $f_c$ equal to 400 kHz.

Nevertheless, it is clear that the invention is not limited to this particular embodiment, and applies in particular to other values of p and/or using more two successive pairs of division ratios.

What is claimed is:

1. A frequency divider comprising a prescaler followed by a programmable counter, and serving to divide a first frequency by an overall division ratio D expressed as $D=k.N+A$, to obtain a second frequency, wherein:

said prescaler operates with a pair of division ratios, k/k+1, and including a switching circuit to switch from the higher division ratio k+1 to the lower division ratio k of said operating pair k/k+1 as a function of a modulus control signal, N is a first predetermined programmable value corresponding to the division ratio of said programmable counter, A is a second predetermined programmable value such that when A is reached by the programmable counter, the prescaler receives said modulus control signal, and A satisfies the relationship $0 \leq A < N$, said prescaler has at least two successive pairs of division ratios, written respectively p/p+1, p+1/p+2, p+2/p+3, etc., and said prescaler includes a selector for dynamically selecting one of said pairs of division ratios as a function of a selection signal, the selected pair constituting said operating pair k/k+1, said selection signal depending on said overall division ratio D that said frequency divider is to apply.

2. A divider according to claim 1, wherein N has a minimum value $N_{min}$, such that: $N_{min}=S(p/c)$, where:

p is the smaller division ratio of the first of said successive pairs of division ratios p/p+1, p+1/p+2, p+2/p+3, etc.;

S is a function such that S(x) is the first integer greater than or equal to x; and c is the number of successive pairs of division ratios p/p+1, p+1/p+2, p+2/p+3, etc.

3. A divider according to claim 1, wherein said prescaler can switch dynamically between the following two successive pairs of division ratios: 127 & 128, and 128 & 129, as a function of said selection signal.

4. A frequency synthesizer of the phase-locked loop type, the synthesizer comprising:

a phase comparator receiving both a loop frequency $f_b$ and a comparison frequency $f_h$ which is obtained from a clock frequency $f_h$ as delivered by a resonant element;

a loop filter receiving the output from said phase comparator;

a voltage controlled oscillator receiving the output from said loop filter, and generating the output frequency $f_s$ of said synthesizer; and a programmable divider dividing said output frequency $f_s$ to obtain said loop frequency $f_b$;

wherein said programmable divider comprises a frequency divider enabling said output frequency $f_s$ to be divided by an overall division ratio D so as to obtain said loop frequency $f_b$, said frequency divider comprising:

a prescaler operating with a pair of division ratios, k/k+1, including a switching circuit to switch from the higher division ratio k+1 to the lower division ratio k of said operating pair k/k+1 as a function of a modulus control signal, wherein, and a programmable counter following said prescaler, said prescaler and programmable counter dividing a first frequency by said overall division ratio D expressed as $D=k.N+A$, to obtain a second frequency, wherein N is a first predetermined programmable value corresponding to the division ratio of said programmable counter, and A is a second predetermined programmable value, $0<A<N$ such that when A is reached by the programmable counter, said prescaler receives said modulus control signal; and said prescaler has at least two successive pairs of division ratios, written respectively p/p+1, p+1/p+2, p+2/p+3, etc., and said prescaler includes a selector for dynamically selecting one of said pairs of division ratios as a function of a selection signal, the selected pair constituting said operating pair k/k+1, said selection signal depending on said overall division ratio D that said frequency divider is to apply.

5. A frequency prescaler for use in a frequency divider, said prescaler having pair of division ratios, k/k+1, said prescaler including:

a switching circuit to switch from the higher division ratio k+1 to the lower division ratio k of said operating pair k/k+1 as a function of a modulus control signal, wherein the prescaler has at least two successive pairs of division ratios respectively written p/p+1, p+1/p+2, p+2/p+3, etc.; and a selector for dynamically selecting one of said pairs of division ratios as a function of a selection signal, the selected pair constituting said operating pair k/k+1, said selection signal depending on the overall division ratio that the frequency divider is to apply.

* * * * *